US012707669B2

(12) United States Patent
Wang et al.

(10) Patent No.: US 12,707,669 B2
(45) Date of Patent: Aug. 11, 2026

(54) FINFET DEVICE STRUCTURE WITH EXTRA FIN

(71) Applicant: TAIWAN SEMICONDUCTOR MANUFACTURING COMPANY, LTD., Hsinchu (TW)

(72) Inventors: Yi Hong Wang, Taichung (TW); Hui-Hsuan Kung, Taichung (TW); Yi-Lii Huang, Hsinchu (TW); Chih-Hsiao Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 425 days.

(21) Appl. No.: 18/237,811

(22) Filed: Aug. 24, 2023

(65) Prior Publication Data

US 2025/0072038 A1 Feb. 27, 2025

(51) Int. Cl.

*H10D 30/62* (2025.01)
*H10D 30/01* (2025.01)
*H10D 84/01* (2026.01)
*H10D 84/85* (2025.01)

(52) U.S. Cl.

CPC ....... *H10D 30/6211* (2025.01); *H10D 30/024* (2025.01); *H10D 84/0193* (2025.01); *H10D 84/853* (2025.01)

(58) Field of Classification Search

CPC ............ H10D 30/6211; H10D 30/024; H10D 84/0193; H10D 84/853; H10D 84/0151; H10D 30/6219

See application file for complete search history.

(56) References Cited

U.S. PATENT DOCUMENTS

| | | | | |
|---|---|---|---|---|
| 8,603,893 | B1 * | 12/2013 | Wei .................... | H10D 30/0243 257/E21.546 |
| 2013/0065326 | A1 * | 3/2013 | Sudo .................. | H10D 84/0158 438/283 |
| 2017/0140992 | A1 * | 5/2017 | Chang .................. | H10D 84/038 |
| 2017/0207217 | A1 * | 7/2017 | Hellings ............ | H10D 30/6211 |
| 2020/0058508 | A1 * | 2/2020 | Yu ........................ | H10D 84/038 |
| 2021/0343578 | A1 * | 11/2021 | Chang .................. | H10D 84/038 |
| 2022/0059678 | A1 | 2/2022 | Jhan et al. | |
| 2022/0130991 | A1 | 4/2022 | Yu et al. | |
| 2022/0320283 | A1 | 10/2022 | Shen | |
| 2022/0359504 | A1 | 11/2022 | Liaw | |

* cited by examiner

*Primary Examiner* — Changhyun Yi
(74) *Attorney, Agent, or Firm* — NZ Carr Law Office

(57) ABSTRACT

Embodiments of the present disclosure provide a FinFET semiconductor including a first set of fin structures that are active, a source/drain (S/D) region in contact with the first set of fin structures, a second set of fin structures separated, via a shallow trench isolation (STI) feature, from the first set of fin structures, a contact etch stop layer (CESL) over the S/D region and over the second set of fin structures, and a gate over the first set of fin structures and over the second set of fin structures, the gate including a gate dielectric and a gate electrode over the gate dielectric. The second set of fin structures includes one or more non-active fin structures that are in contact with the CESL without being in contact with the S/D region.

20 Claims, 13 Drawing Sheets

FINFET DEVICE STRUCTURE WITH EXTRA FIN

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenges.

In pursuit of higher device density, higher performance, and lower costs, challenges from both fabrication and design issues have resulted in the development of three-dimensional designs, such as a multi-gate field effect transistor (FET), including a FinFET. In a FinFET, the channel region includes a non-planar fin shape that is surrounded on three sides by the gate electrode, which allows for fuller depletion in the channel and results in less short-channel effects and better gate control. As transistor dimensions are continually scaled down, further improvements of the FinFET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
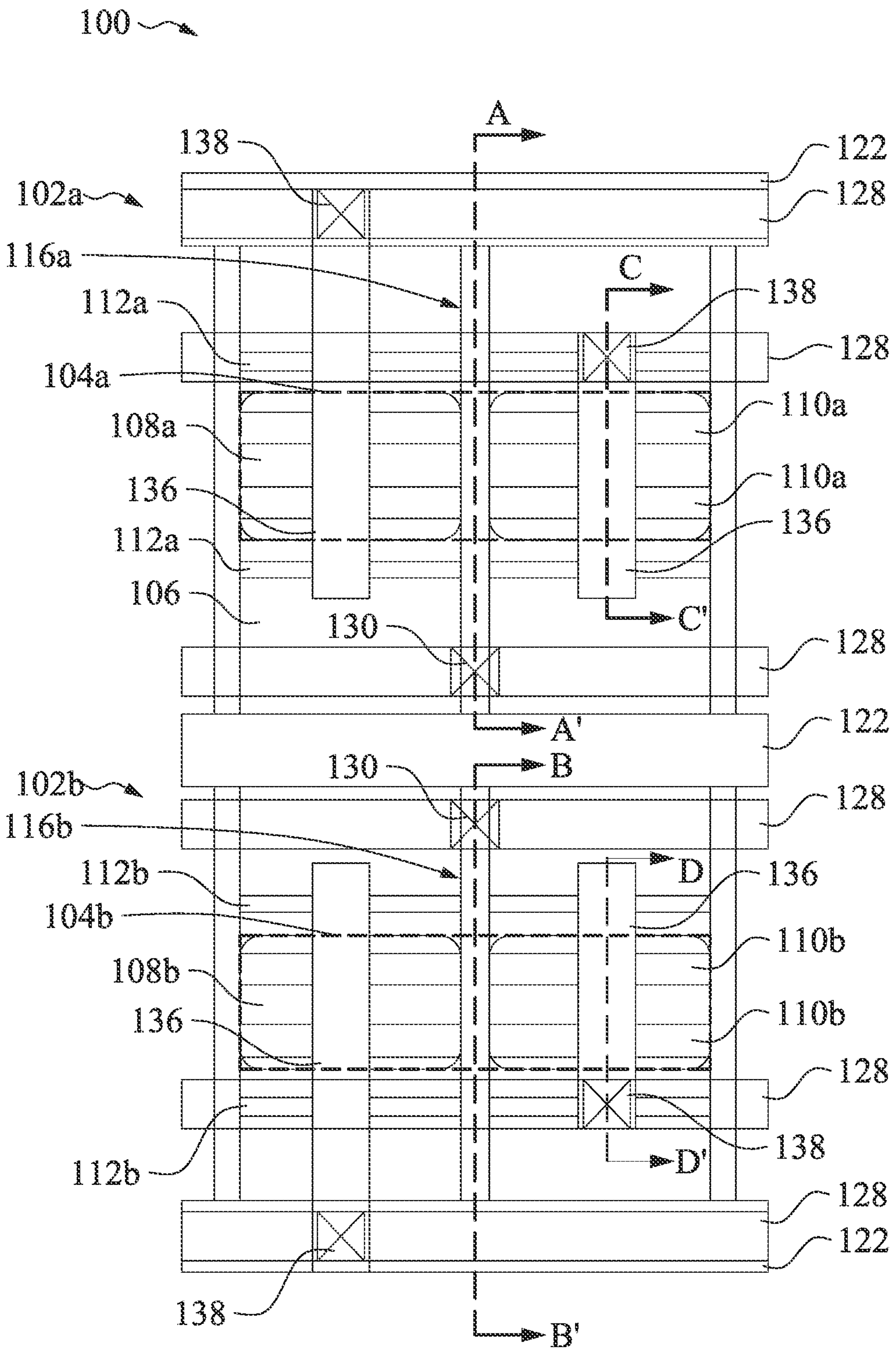
FIG. 1 is a schematic top view of an example semiconductor device, according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and also may include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to FinFETs, implementations of some aspects of the present disclosure may be used in other processes and/or in other devices, such as planar FETs, nanosheet channel FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The foregoing broadly outlines some aspects of embodiments described in this disclosure. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain region(s) may refer to a source or a drain, individually or collectively dependent upon the context.

FIG. 1 is a schematic top view of an example semiconductor device 100, according to embodiments of the present disclosure. As shown in FIG. 1, the semiconductor device 100 may include a first FinFET device 102*a* and a second FinFET device 102*b*. The first FinFET device 102*a* may include a first active region 104*a* that includes, for example, a first source/drain (S/D) region 108*a*. The second FinFET device 102*b* may include a second active region 104*b* that includes, for example, a second S/D region 108*b*. As used herein, the term "active region" refers to a region of the device (e.g., the area inside the dashed lines shown in FIG. 1) that is associated with (e.g., in contact with) one or more n-type or p-type doped S/D features. The first active region 104*a* and the second active region 104*b* may be materially and/or functionally different from each other (e.g., based on material and/or functional differences between the first S/D region 108*a* and the second S/D region 108*b*, as described in more detail below).

The semiconductor device 100 may include a substrate 106. The first FinFET device 102*a* and the second FinFET device 102*b* may be fabricated on the substrate 106. The substrate 106 may be a semiconductor substrate. The substrate 106 may include a single crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), and/or combinations thereof. In some embodiments, the substrate 106 may be made of silicon. In some embodiments, the substrate 106 may be a silicon-on-insulator (SOI) substrate having an insulating layer (not shown) disposed between two silicon layers. For example, the insulating layer may be an oxygen-containing layer.

The substrate 106 may include various regions that have been doped with impurities (e.g., dopants having p-type or n-type conductivity). Depending on circuit design, the dopants may be, for example, boron for p-type field effect transistors (p-type FETs) and phosphorus for n-type field effect transistors (n-type FETs). For example, the substrate 106 may include one or more of a p-type well ("p-well") and an n-type well ("n-well").

The semiconductor device 100 may include a plurality of fin structures that are defined on (e.g., formed from) the substrate 106. In some embodiments, the fin structures may be made of Si, Ge, GaAs, SiC, GaN, C, In, other suitable materials, and/or combinations thereof. A mask structure may be formed over the substrate 106 prior to forming the fin structures. The mask structure may include a pad layer and a hard mask. The pad layer may be an oxygen-containing layer, such as a $SiO_2$ layer, or a nitrogen-containing layer, such as $Si_3N_4$. The mask structure may be formed by any suitable deposition process, such as chemical vapor deposition (CVD) process.

The fin structures may be fabricated using suitable processes including photolithography and etch processes. For example, the photolithography process may include forming a photoresist layer over the mask structure, exposing the resist to a pattern, performing post-exposure bake processes, and developing the resist to form a patterned resist. The patterned resist may then be used to protect regions of the substrate 106, and layers formed thereon, while an etch process forms trenches in unprotected regions through the mask structure and into the substrate 106, thereby leaving the extending fin structures. The trenches may be etched using a dry etch (e.g., RIE), a wet etch, and/or combinations thereof.

The first FinFET device 102*a* may include a first set of fin structures 110*a* and a second set of fin structures 112*a*. As used herein, the term "set" may include one or more of the respective features (e.g., one or more fin structures). The fin structures 110*a*, of the first set, are active (e.g., defined in the first active region 104*a*, or in connection with the first source/drain region 108*a*). For example, at least portions of the fin structures 110*a* (e.g., longitudinal end portions) may be recessed to allow respective S/D features of the first S/D region 108*a* to be epitaxially grown from the fin structures 110*a*.

The second set of fin structures 112*a* may be referred to as "extra fin structures" or "auxiliary fin structures." The extra fin structures may be active or non-active based on the structure of the FinFET device. In FIGS. 1-5, the fin structures 112*a*, of the second set, are non-active (e.g., being defined outside the first active region 104*a*, or not in connection with the first source/drain region 108*a*). For example, the fin structures 112*a* may be separated from the first S/D region 108*a* by one or more dielectric materials (e.g., contact etch stop layer (CESL) 140), as described in more detail below.

The second FinFET device 102*b* may include a third set of fin structures 110*b* and a fourth set of fin structures 112*b*. The fin structures 110*b*, of the third set, are active (e.g., defined in the second active region 104*b*, or in connection with the second source/drain region 108*b*). For example, at least portions of the fin structures 110*b* (e.g., longitudinal end portions) may be recessed to allow respective S/D features of the second S/D region 108*b* to be epitaxially grown from the fin structures 110*b*. The fourth set of fin structures 112*b*, like the second set, may be referred to as "extra fin structures" or "auxiliary fin structures." The extra fin structures may be active or non-active based on the structure of the FinFET device. In FIGS. 1-5, the fin structures 112*b*, of the fourth set, are non-active (e.g., being defined outside the second active region 104*b*, or not in connection with the second source/drain region 108*b*). For example, the fin structures 112*b* may be separated from the second S/D region 108*b* by one or more dielectric materials (e.g., CESL 140), as described in more detail below.

Figure 2:
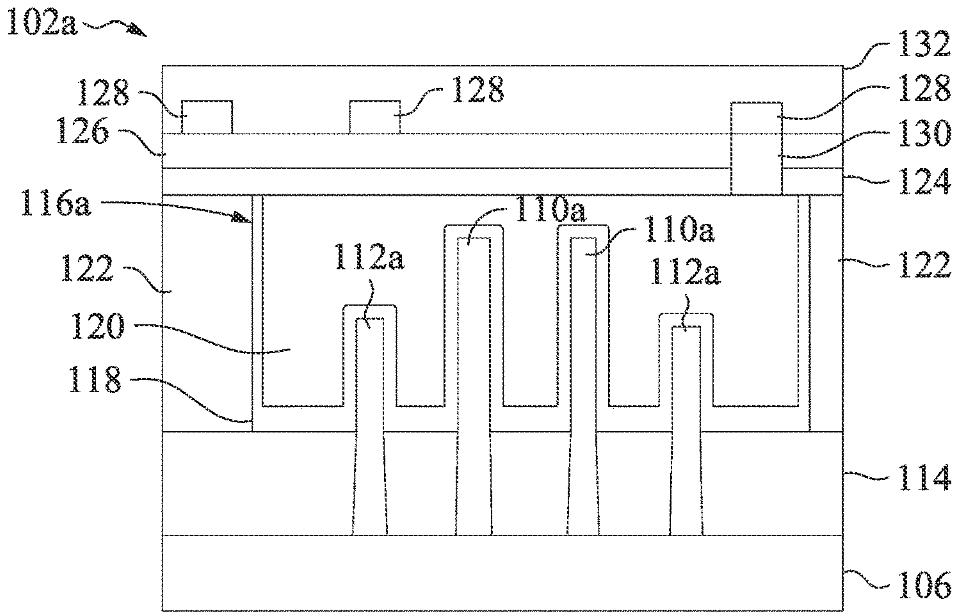
FIG. 2 is a schematic cross-sectional view, of an example FinFET device of FIG. 1, taken along section line A-A', according to embodiments of the present disclosure.
Figure 3:
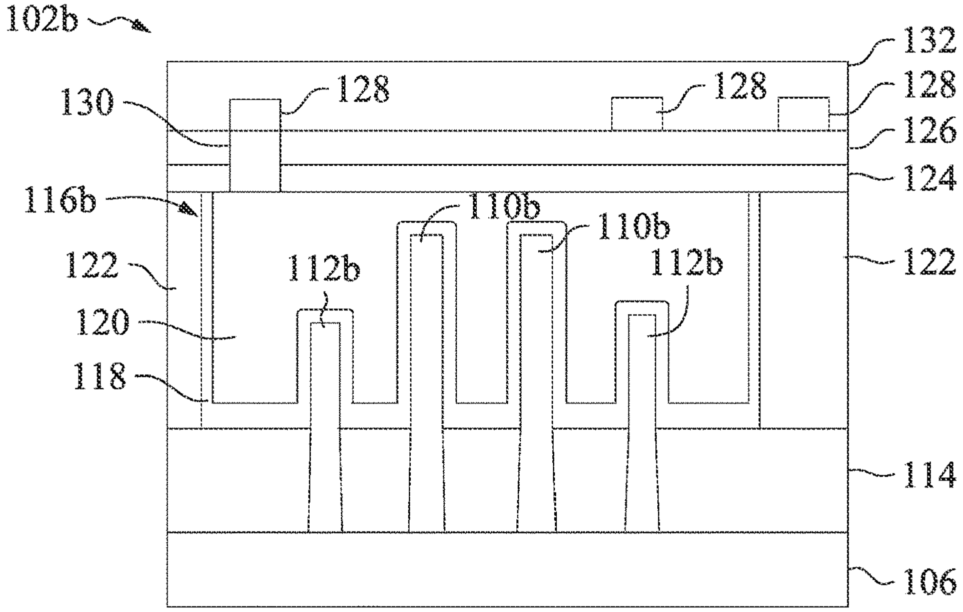
FIG. 3 is a schematic cross-sectional view, of another example FinFET device of FIG. 1, taken along section line B-B', according to embodiments of the present disclosure.

FIG. 2 is a schematic cross-sectional view, of an example FinFET device of FIG. 1, taken along section line A-A', according to embodiments of the present disclosure. FIG. 3 is a schematic cross-sectional view, of another example FinFET device of FIG. 1, taken along section line B-B', according to embodiments of the present disclosure.

As shown in FIGS. 2-3, the semiconductor device 100 may include a shallow trench isolation (STI) feature (e.g., insulating material 114) around a lower portion of the fin structures 110*a*, 112*a*, 110*b*, 112*b*. For example, the insulating material 114 may be formed in the trenches between the fin structures 110*a*, 112*a*, 110*b*, 112*b*. In some embodiments, the fin structures 110*a*, 110*b* are partially embedded in the insulating material 114. In some embodiments, the fin structures 112*a*, 112*b* may be partially or fully embedded in the insulating material 114 depending on the function of the fin structures 112*a*, 112*b*. In some embodiments, a planarization operation, such as a chemical mechanical polishing (CMP) method, and/or an etch-back method, may be performed to remove a portion of the insulating material 114 and/or to expose the fin structures (e.g., top surfaces of the fin structures). The insulating material 114 may be made of silicon oxide, silicon nitride, silicon oxynitride (SiON), SiOCN, SiCN, fluorine-doped silicate glass (FSG), a low-k dielectric material, or any suitable dielectric material. The insulating material 114 may be formed by any suitable method, such as low-pressure chemical vapor deposition (LPCVD), plasma enhanced CVD (PECVD), or flowable CVD (FCVD).

The first FinFET device 102*a* may include a first gate 116*a*. The first gate 116*a* crosses over the first set of fin structures 110*a* and the second set of fin structures 112*a*. The second FinFET device 102*b* may include a second gate 116*b*. The second gate 116*b* crosses over the third set of fin structures 110*b* and the fourth set of fin structures 112*b*. Portions of the fin structures that are located between two source/drain regions 108*a*, 108*b* or in a gate region (e.g., being overlapped by the first gate 116*a* or the second gate 116*b*) may be defined as "channels." In some embodiments, the first gate 116*a* and the second gate 116*b* may be combined together as a single, integral gate structure. The gate 116 (e.g., first gate 116*a* and second gate 116*b*) may include a gate dielectric 118 and a gate electrode 120. The gate dielectric 118 may be located between (e.g., at an interface between) the fin structures (e.g., top and side surfaces of the fin structures) and the gate electrode 120. In some embodiments, the gate dielectric 118 may be made of Si, O, Hf, La, Zr, Zn, N, other suitable materials, and/or combinations thereof. In some embodiments, the gate dielectric 118 may include an interfacial layer and a high-k dielectric layer. For example, the interfacial layer may include a dielectric material, such as silicon oxide, hafnium silicate, or silicon oxynitride. High-k gate dielectrics, as used and described herein, include dielectric materials having a high dielectric constant, for example, greater than that of thermal silicon oxide, which is about 3.9. For example, the high-k dielectric layer may include hafnium oxide, titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), other suitable materials, and/or combinations thereof.

In some embodiments, the gate electrode 120 may include a single layer, or multi-layer, structure that includes a metal layer with a selected work function to enhance the device performance (work function metal layer), a liner layer, a wetting layer, an adhesion layer, a metal alloy, a metal silicide, and/or combinations thereof. For example, the gate electrode 120 may include Ag, Au, Rh, Mo, Zn, Nb, Ta, Zr, aluminum (Al), tungsten (W), nickel (Ni), titanium (Ti), ruthenium (Ru), cobalt (Co), platinum (Pt), copper (Cu), metal alloys such as titanium nitride (TiN), brass, phosphor bronze, cast steel, titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), tantalum carbide (TaC), or tantalum silicon nitride (TaSiN), other refractory metals, other suitable metal materials, and/or combinations thereof.

In practice, certain aspects of the material of the gate electrode 120 (which also may be referred to herein as a "work function metal" or "WFM") are associated with device performance. For example, the material composition and/or thickness of the WFM may be used to tune (e.g., optimize) or otherwise adjust device performance. However, device scaling (to smaller dimensions) may result in gate volumes being limited, the WFM being harder to fill, and tuning of device threshold voltage ($V_t$) being more difficult to perform, with a resultant limitation on device types. Embodiments of the present disclosure address one or more of these issues, for example, through control of one or more extra fin structures, as described in more detail below.

Referring, collectively, to FIGS. 1-3, the gate 116 may extend lengthwise in a direction that is perpendicular to the fin structures. The gate 116 may terminate at one or more gate end dielectric features 122 (e.g., dielectric fin structures). For example, the one or more gate end dielectric features 122 may be located at first and second opposite longitudinal ends of the gate 116. In some implementations, the one or more gate end dielectric features 122 may be formed of silicon oxide, silicon nitride, silicon carbide, silicon oxynitride, silicon carbonitride, silicon oxycarbide, silicon oxycarbonitride, porous oxide, and/or combinations thereof.

In some embodiments, an optional etch stop dielectric layer 124 may be formed over the gate 116. For example, the etch stop dielectric layer 124 may be a blanket layer that is formed over a top surface of the gate 116 and over the one or more gate end dielectric features 122. In some embodiments, the etch stop dielectric layer 124 may be formed of low-k dielectric materials, such as tetraethylorthosilicate (TEOS) oxide, un-doped silicate glass, or doped silicon oxide, such as borophosphosilicate glass (BPSG), fused silica glass (FSG), phosphosilicate glass (PSG), boron doped silicon glass (BSG), and/or combinations thereof.

In some embodiments, an interlayer dielectric (ILD) layer 126 may be formed over the etch stop dielectric layer 124. In some embodiments, the ILD layer 126 may be formed of the same, or similar, material compositions as the etch stop dielectric layer 124.

In some embodiments, one or more metal lines 128, of a conductive layer, may be formed over the ILD layer 126. For example, the one or more metal lines 128 may extend lengthwise in a direction that is perpendicular to the gate 116 and/or parallel to the fin structures. In some embodiments, a gate contact via 130 may extend from a metal line 128, of the conductive layer, to the gate 116. For example, the gate contact via 130 may extend vertically in a direction that is perpendicular to the gate 116 and the fin structures. In some embodiments, the one or more metal lines 128 and the gate contact via 130 may be formed of titanium (Ti), titanium nitride (TiN), tantalum nitride (TaN), platinum (Pt), copper (Cu), aluminum (Al), ruthenium (Ru), tungsten (W), nickel (Ni), cobalt (Co), and/or combinations thereof.

In some embodiments, an inter metal dielectric (IMD) layer 132 may be formed over the conductive layer (e.g., surrounding the one or more metal lines 128). In some embodiments, the IMD layer 132 may be formed of the same, or similar, material compositions as the etch stop dielectric layer 124 and/or the ILD layer 126.

Figure 4:
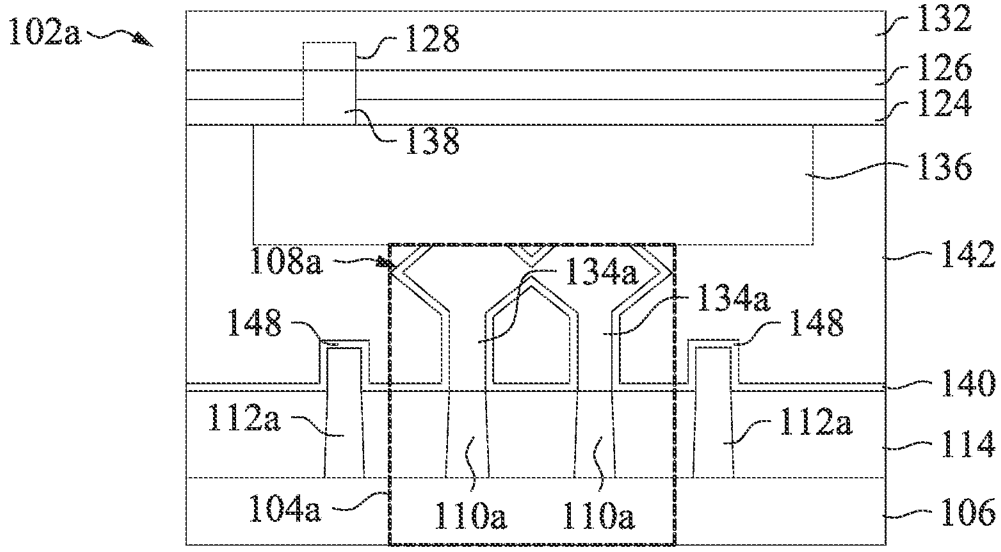
FIG. 4 is a schematic cross-sectional view, of an example FinFET device of FIG. 1, taken along section line C-C', according to embodiments of the present disclosure.
Figure 5:
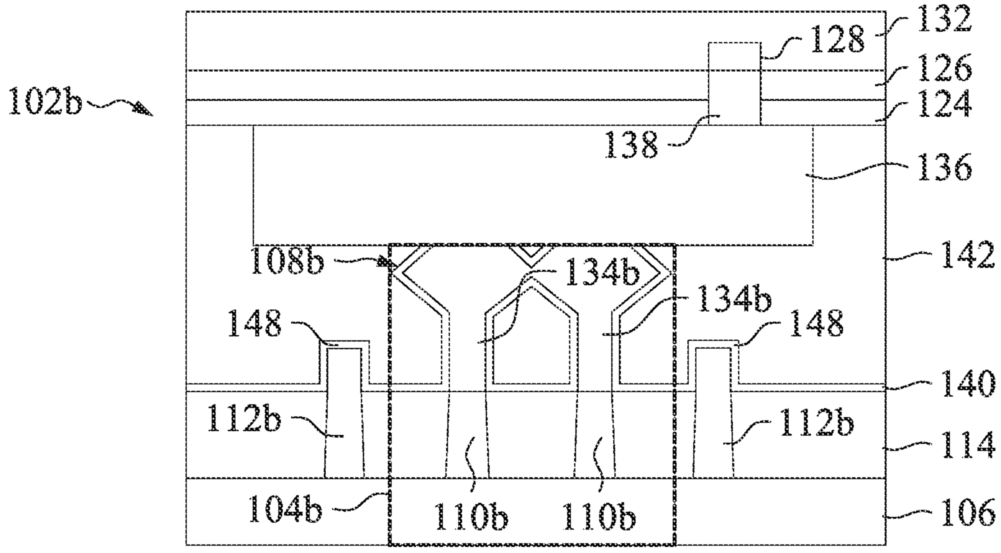
FIG. 5 is a schematic cross-sectional view, of another example FinFET device of FIG. 1, taken along section line D-D', according to embodiments of the present disclosure.

FIG. 4 is a schematic cross-sectional view, of an example FinFET device of FIG. 1, taken along section line C-C', according to embodiments of the present disclosure. FIG. 5 is a schematic cross-sectional view, of another example FinFET device of FIG. 1, taken along section line D-D', according to embodiments of the present disclosure.

As shown in FIG. 4, outside the gate region, the first FinFET device 102*a* may include the first S/D region 108*a*. For example, the first S/D region 108*a* may include n-type epitaxial S/D features 134*a* (e.g., in contact with the fin structures 110*a* of the first set). As shown in FIG. 5, outside the gate region, the second FinFET device 102*b* may include the second S/D region 108*b*. For example, the second S/D region 108*b* may include p-type epitaxial S/D features 134*b* (e.g., in contact with the fin structures 110*b* of the third set). In some embodiments, the epitaxial S/D features 134*a*, 134*b* (collectively 134) described herein may be made of SiC, SiP, SiGe, other suitable materials such as metal components, and/or combinations thereof. A S/D contact 136 may be formed over the S/D region 108*a*, 108*b* (collectively 108) and/or over the epitaxial S/D features 134. For example, the S/D contact 136 may be coupled to (e.g., in contact with) the epitaxial S/D features 134. In some embodiments, the S/D contact may be made of W, Co, Al, Cu, Ag, Au, other suitable materials, and/or combinations thereof. A S/D contact via 138 may be formed in the ILD layer 126 and extend from a metal line 128 of the IMD layer 132 to the S/D contact 136.

Outside the gate region, a sidewall spacer capping layer 148 may be formed over the second set of fin structures 112*a*. The sidewall spacer capping layer 148 may help control epitaxial growth. For example, the sidewall spacer capping layer 148 may be formed of silicon oxide, silicon nitride, silicon carbide, silicon oxynitride, silicon carbonitride, silicon oxycarbide, silicon oxycarbonitride, porous oxide, and/or combinations thereof. Outside the gate region, the CESL 140 is formed over the S/D features 134*a/b*. In some embodiments, the CESL 140 may be formed over the extra fin structures (e.g., fin structures 112*a*, of the second set, and fin structures 112*b*, of the fourth set). In some embodiments, the CESL 140 may be formed of silicon oxide, silicon nitride, silicon carbide, silicon oxynitride, silicon carbonitride, silicon oxycarbide, silicon oxycarbonitride, porous oxide, and/or combinations thereof. The CESL 140 may be located between the insulating material 114, of the STI feature, and another ILD layer 142, which is deposited over the CESL 140.

The extra fin structures 112*a*, 112*b* of FIGS. 1-5 provide certain benefits associated with device performance. For example, the extra fins enable adjustment of the work function of the gate electrode by changing the spatial composition of the WFM, in contrast to traditional techniques that are limited to material and thickness of the WFM. Furthermore, the spacing, height, count, and shape of the extra fins affects filling of the WFM, which further enables tuning of threshold voltage and/or leakage current. The extra fins can provide design density, reduce contact resistance, reduce loading effect during fin formation, enable tuning volume of electrode (e.g., based on fin height in the gate region), help contact positioning, reduce contact resistance, assist tuning shape and/or volume of epitaxial S/D (e.g., based on fin height outside the gate region).

Figure 6:
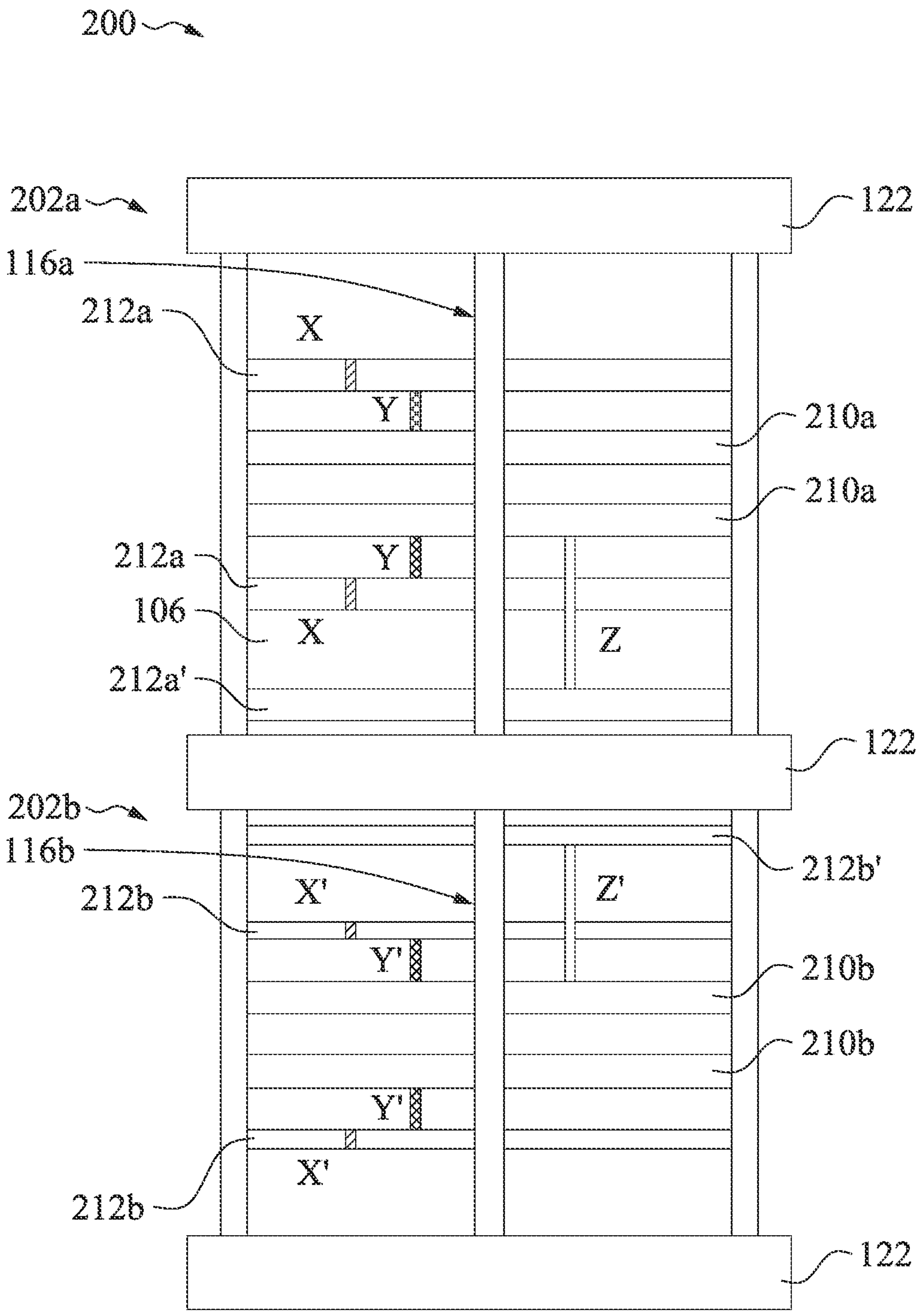
FIG. 6 is a schematic top view of an example semiconductor device illustrating control of spacing of extra fin structures, according to embodiments of the present disclosure.

FIG. 6 is a schematic top view of an example semiconductor device 200 illustrating control of spacing of extra fin structures, according to embodiments of the present disclosure. Semiconductor device 200 is similar to semiconductor device 100 except for variations, with respect to the extra fins, in height, location, shape, count, and/or distance, etc. Certain aspects of the semiconductor device (e.g., S/D regions, metal lines, contact vias, and S/D contacts) are omitted from FIG. 6 for clarity. In some embodiments, the spacing may depend, at least in part, on fin width, fin shape, and/or fin volume. Therefore, two different examples are illustrated in FIG. 6. In the first FinFET device 202*a*, a width X of the extra fin structure 212*a* may be within a range of about 8 nm or less, such as about 6 nm to about 8 nm. A minimum spacing Y between the extra fin structure 212*a* and the adjacent fin structure 210*a* may be within a range of about 2X to about 3X (e.g., about 20 nm to about 22 nm). A maximum spacing Z between the extra fin structure 212*a*' and the adjacent fin structure 210*a* may be within a range of about 5X to about 7X (e.g., about 32 nm to about 42 nm).

In the second FinFET device 202*b*, a width X' of the extra fin structure 212*b* (e.g., measured at the top surface of the fin structure 212*b*) may be within a range of about 0.5X to about 1X (e.g., about 3 nm to about 8 nm, such as about 3 nm to about 6 nm or about 4 nm to about 8 nm). A minimum spacing Y' between the extra fin structure 212*b* and the adjacent fin structure 210*b* may be within a range of about 4X' to about 6X' (e.g., about 20 nm to about 22 nm). A maximum spacing Z' between the extra fin structure 212*b*' and the adjacent fin structure 210*b* may be within a range of about 10X' to about 14X' (e.g., about 32 nm to about 42 nm).

Figure 7:
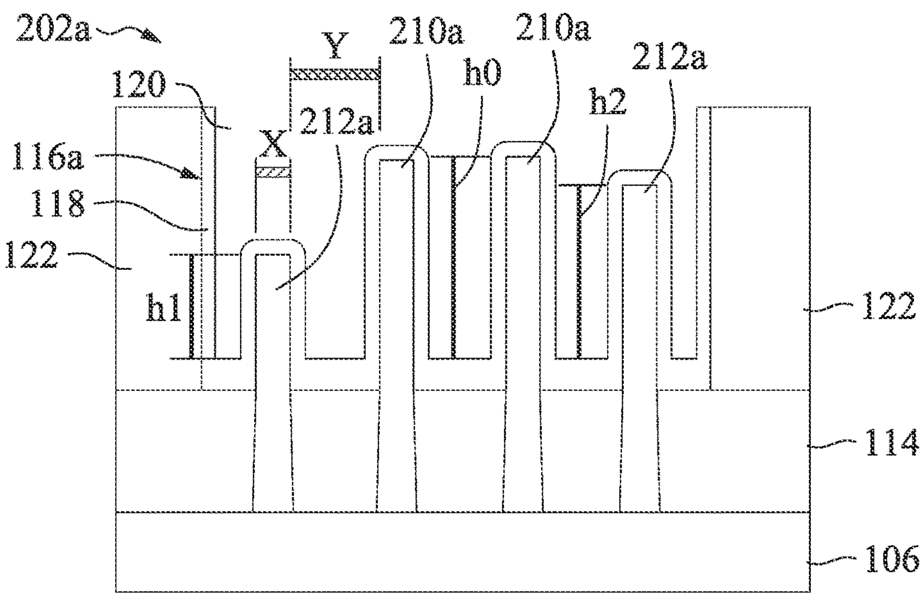
FIG. 7 is a schematic cross-sectional view, of an example FinFET device of FIG. 6, according to embodiments of the present disclosure.

FIG. 7 is a schematic cross-sectional view, of an example FinFET device of FIG. 6, according to embodiments of the present disclosure. Certain aspects of the FinFET device (e.g., dielectric layers, conductive layer, contact vias, and IMD layer) are omitted from FIG. 7 for clarity. As shown in FIG. 7, the extra fin structure 212*a* of the first FinFET device 202*a* may be non-tapered (e.g., rectangular cross-section). For example, the width X of the fin structure 212*a* may be constant. The non-tapered shape corresponds to a volume of the fin structure 212*a* being greater than the volume of an analogous tapered fin structure, as described in more detail below.

As shown in FIG. 7, there may be differences in height between the active fin structures 210*a* and one or more extra fin structures 212*a*. For example, a height h0 of one or more active fin structures 210*a* may be greater than respective heights h1, h2 of the extra fin structures 212*a*. In some embodiments, a ratio of h1/h0 or h2/h0 may be within a range of 0 to 1, such as about 0.2 to about 0.9, about 0.4 to about 0.6, or about 0.5. As shown in FIG. 7, there may be differences in height between one or more of the extra fin structures 212*a*. For example, a first height h1 of a first extra fin structure 212*a* (e.g., on the left side of fin structures 210*a*) may be less than a second height h2 of a second extra fin structure 212*a* (e.g., on the right side of fin structures 210*a*). In some embodiments, a ratio of h1/h2 be within a range of 0 to 1, such as about 0.2 to about 0.95, about 0.4 to about 0.6, or about 0.5. In some other embodiments, the respective heights of the extra fin structures 212*a* may be equal.

Figure 8:
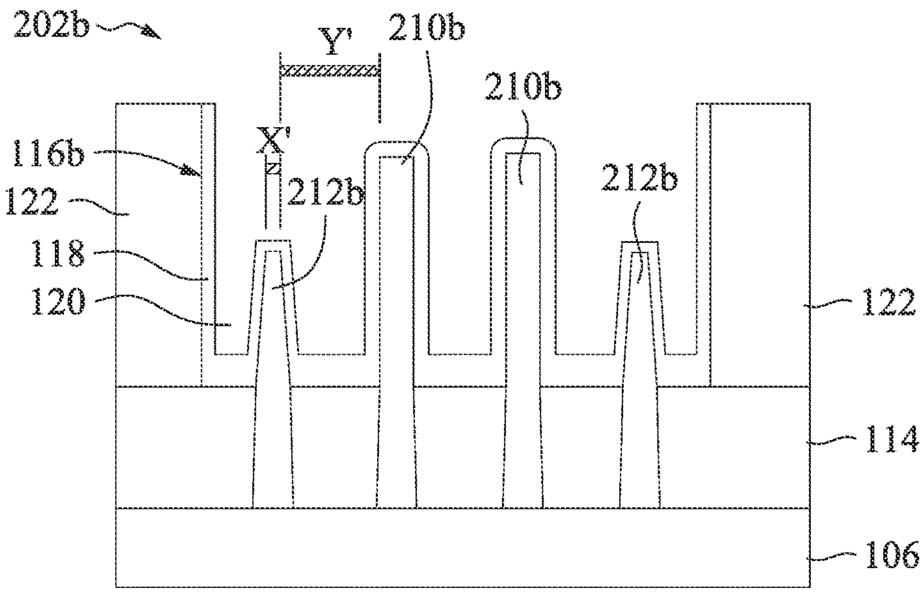
FIG. 8 is a schematic cross-sectional view, of another example FinFET device of FIG. 6, according to embodiments of the present disclosure.

FIG. 8 is a schematic cross-sectional view, of another example FinFET device of FIG. 6, according to embodiments of the present disclosure. Certain aspects of the FinFET device (e.g., dielectric layers, conductive layer, contact vias, and IMD layer) are omitted from FIG. 8 for clarity. As shown in FIG. 8, the extra fin structure 212*b* of the second FinFET device 202*b* may be tapered (e.g., decreasing in size towards the top surface). For example, the width X' of the fin structure 212*b* may be narrowest at the top surface. For example, a tapered width (ratio of X' to X) may be within a range of about 0.5x to about 1x. The tapered shape corresponds to a volume of the fin structure 212*b* being less than the volume of an analogous non-tapered fin structure (e.g., with a rectangular cross-section). As shown in FIG. 8, the heights of the extra fin structures 212*b* are equal. In some other embodiments, the respective heights of the extra fin structures 212*b* may be different.

The differences in fin spacing, fin width, fin shape, fin height, and fin volume, described above, can provide, independently or in combination, many different knobs for tuning device performance. Examples illustrating control of device performance, based on the various control knobs identified herein, are provided below.

FIGS. 9-12 are schematic cross-sectional views of example FinFET devices of FIG. 1 or 6, according to embodiments of the present disclosure. FinFET devices 302, 402*a*, 402*b*, 502, 602 are similar to FinFET devices 102*a*, 102*b*, 202*a*, 202*b* except for variations in gate electrode material composition and, with respect to the extra fins, in height, location, shape, count, and/or distance, etc. Certain aspects of the FinFET devices (e.g., dielectric layers, conductive layer, contact vias, and IMD layer) are omitted from FIGS. 9-12 for clarity. In some embodiments, the FinFET devices may be patterned to deposit different compositions of WFM in the gate electrode 120, as described in more detail below. As used herein, the terms "pattern," "patterned," and "patterning" may refer to a multi-step process that includes, for example, forming a mask over an upper surface of a respective layer, patterning the mask using photolithography to remove portions of the mask and expose portions of the upper surface of the respective layer, etching through the patterned mask to remove portions of the respective layer, and/or removing the patterned mask using a suitable process (e.g., ashing or dissolution with a solvent, among other examples).

Figure 9:
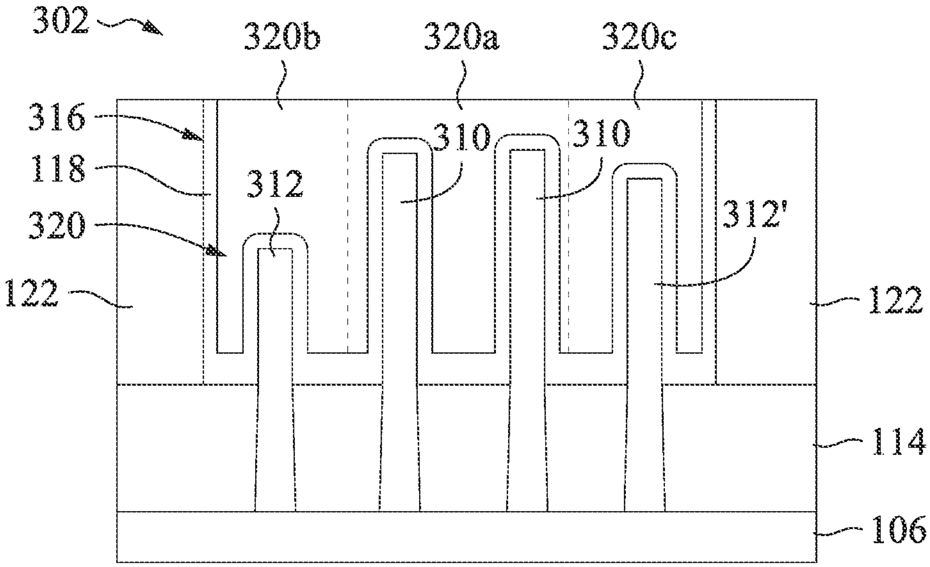
FIGS. 9-12 are schematic cross-sectional views of example FinFET devices of FIG. 1 or 6, according to embodiments of the present disclosure.

As shown in FIG. 9, a FinFET device 302 includes a first set of fin structures 310, a second set of extra fin structures 312/312', and a gate 316 over both the first and second sets of fin structures. The gate 316 may include a gate electrode 320 with a plurality of (e.g., three) distinct material compositions. For example, the gate electrode 320 may include a first portion 320*a* (e.g., surrounding the first set of fin structures 310), a second portion 320*b* (e.g., surrounding a first extra fin structure 312), and a third portion 320*c* (e.g., surrounding a second extra fin structure 312'). In some embodiments, one or more of the first portion 320*a*, the second portion 320*b*, or the third portion 320*c* may have a material composition that is different from one or more other portions of the gate electrode 320. For example, all the material compositions may be different from each other. In some embodiments, material compositions of the second portion 320*b* and the third portion 320*c* may be the same as each other and may be different from the material composition of the first portion 320*a*. In some embodiments, the material compositions may include p-type dopants, n-type dopants, low resistance, high resistance, different work functions, etc. In some embodiments, material compositions and physical aspects of the extra fin structures 312/312' may be implemented, independently or combined, to tune device performance. For example, as shown in FIG. 9, the height of the extra fin structure 312 located in the second portion 320*b* of the gate electrode 320 is less than the height of the extra fin structure 312' located in the third portion 320*c*. This difference in height, independently or in combination with differences in material compositions between the second portion 320*b* and the third portion 320*c*, can provide improved (e.g., synergistic effects on) tuning of device performance. In some other embodiments, the respective heights of the extra fin structures 312/312' may be equal.

Figure 10:
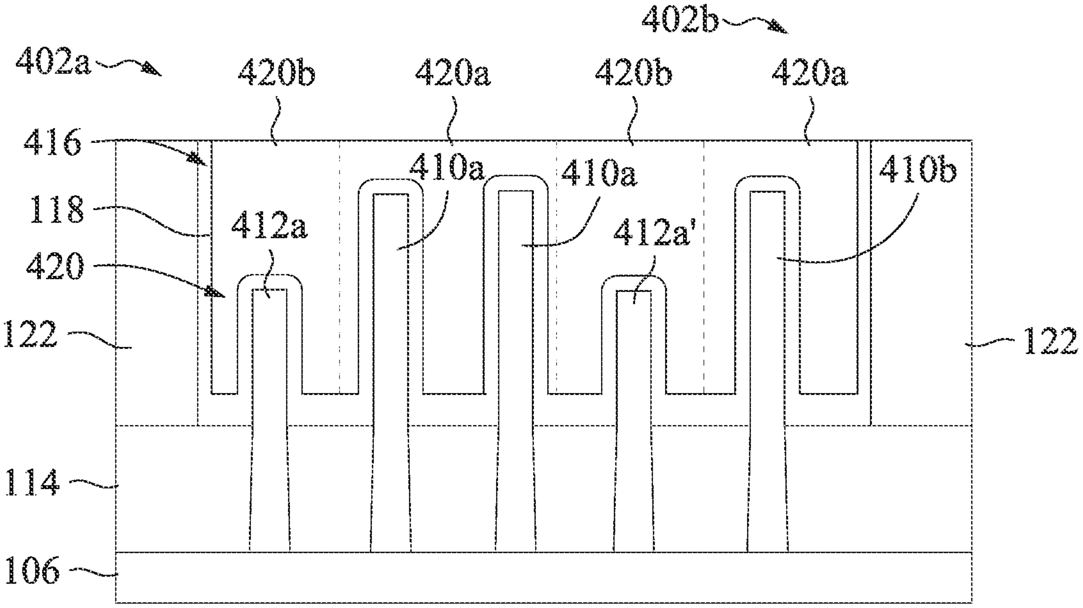

As shown in FIG. 10, another device 402*a/b* includes a first set of fin structures 410*a* of a first FinFET device 402*a*, a second set of fin structures 410*b* of a second FinFET device 402*b*, a third set of extra fin structures 412*a/a*', and a gate 416 over all of the first, second, and third sets of fin structures. The gate 416 may include a gate electrode 420 with a plurality of (e.g., two) distinct material compositions. For example, the gate electrode 420 may include a first portion 420*a* (e.g., surrounding the first set of fin structures 410*a* and the second set of fin structures 410*b*) and a second portion 420*b* (e.g., surrounding a first extra fin structure 412*a* and a second extra fin structure 412*a*'). In some embodiments, the first portion 420*a* and the second portion 420*b* may be alternating. In some embodiments, the first portion 420*a* and the second portion 420*b* may have material compositions that are different from each other. In some other embodiments, the material compositions may be the same as each other. In some embodiments, the material compositions may include p-type dopants, n-type dopants, low resistance, high resistance, different work functions, etc.

As shown in FIG. 10, the second extra fin structure 412*a*' is adjacent to (e.g., between) fin structures of both the first FinFET device 402*a* and the second FinFET device 402*b*. Therefore, the second extra fin structure 412*a*' may be referred to as an "inner" fin, whereas the first extra fin structure 412*a* may be referred to as an "outer" fin. The proximity of the inner fin to the active fin structures on more than one side (e.g., both opposite sides) can provide improved tuning of device performance. As shown in FIG. 10, the heights of the extra fin structures 412*a/a*' are equal. In some other embodiments, the respective heights of the extra fin structures 412*a/a*' may be different.

Figure 11:
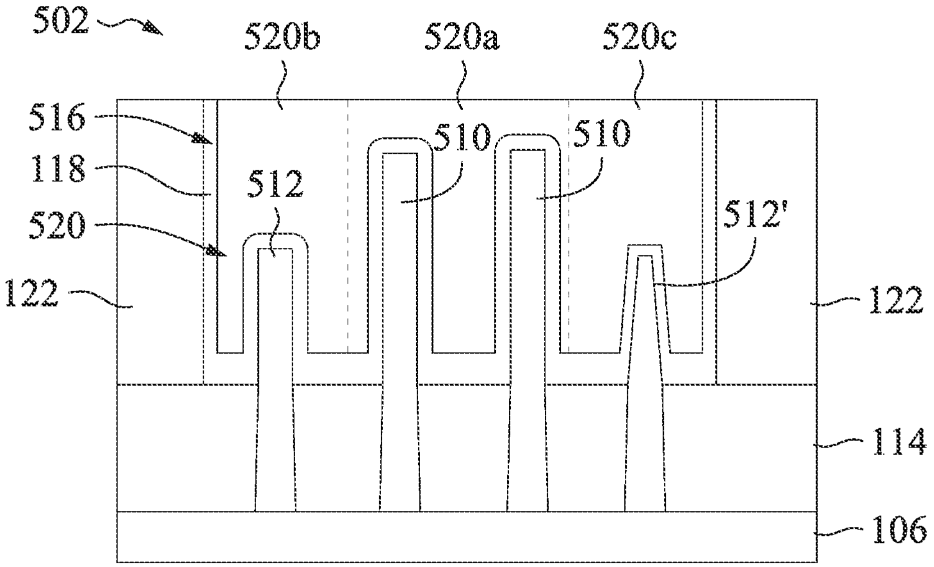

As shown in FIG. 11, a FinFET device 502 includes a first set of fin structures 510, a second set of extra fin structures 512/512', and a gate 516 over both the first and second sets of fin structures. The gate 516 may include a gate electrode 520 with a plurality of (e.g., three) distinct material compositions. For example, the gate electrode 520 may include a first portion 520*a* (e.g., surrounding the first set of fin structures 510), a second portion 520*b* (e.g., surrounding a first extra fin structure 512), and a third portion 520*c* (e.g., surrounding a second extra fin structure 512'). In some embodiments, one or more of the first portion 520*a*, the second portion 520*b*, or the third portion 520*c* may have a material composition that is different from one or more other portions of the gate electrode 520. For example, all the material compositions may be different from each other. In some embodiments, material compositions of the second portion 520*b* and the third portion 520*c* may be the same as each other and may be different from the material composition of the first portion 520*a*. In some embodiments, the material compositions may include p-type dopants, n-type dopants, low resistance, high resistance, different work functions, etc.

In some embodiments, material compositions and physical aspects of the extra fin structures 512/512' may be implemented, independently or combined, to tune device performance. For example, as shown in FIG. 11, the extra fin structure 512 located in the second portion 520*b* of the gate electrode 520 is non-tapered, and the extra fin structure 512' located in the third portion 520*c* is tapered. The tapered shape corresponds to a volume of the extra fin structure 512' being less than the volume of an analogous non-tapered fin structure 512. As shown in FIG. 11, the heights of the extra fin structures 512/512' are equal. In some other embodiments, the respective heights of the extra fin structures 512/512' may be different. The difference in shape/volume, independently or in combination with differences in material compositions between the second portion 520*b* and the third portion 520*c*, can provide improved (e.g., synergistic effects on) tuning of device performance.

Figure 12:
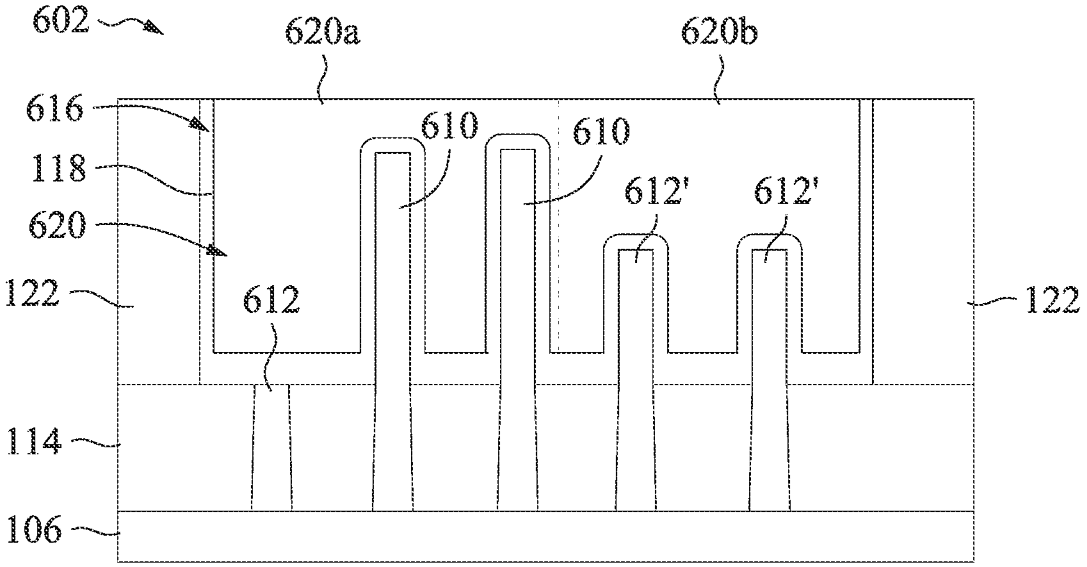

As shown in FIG. 12, a FinFET device 602 includes a first set of fin structures 610, a second set of extra fin structures 612/612', and a gate 616 over both the first and second sets of fin structures. The gate 616 may include a gate electrode 620 with a plurality of (e.g., two) distinct material compositions. For example, the gate electrode 620 may include a first portion 620*a* (e.g., surrounding the first set of fin structures 610 and a first extra fin structure 612) and a second portion 620*b* (e.g., surrounding second and third extra fin structures 612'). In some embodiments, the first portion 620*a* and the second portion 620*b* may have material compositions that are different from each other. In some other embodiments, the material compositions may be the same as each other. In some embodiments, the material compositions may include p-type dopants, n-type dopants, low resistance, high resistance, different work functions, etc.

In some embodiments, material compositions and physical aspects of the extra fin structures 612/612' may be implemented, independently or combined, to tune device performance. For example, as shown in FIG. 12, the extra fin structure 612 does not extend into the gate 616 (e.g., ending below the gate dielectric 118). In some embodiments, the extra fin structure 612 may be formed, or cut, to have a height such that the top surface is below the gate 616. Device performance may be tuned based on the FinFET device 602 including the gate 616 without the extra fin structure 612.

As shown in FIG. 12, more than one (e.g., two) extra fin structures 612' are located on the same side (e.g., on a first side, of first and second opposite sides) of the first set of fin structures 610. As shown in FIG. 12, the heights of the extra fin structures 612' are equal. In some other embodiments, the respective heights of the extra fin structures 612' may be different. The difference in count and/or distance, independently or in combination with differences in material compositions between the first portion 620*a* and the second portion 620*b* can provide improved (e.g., synergistic effects on) tuning of device performance.

Figure 13:
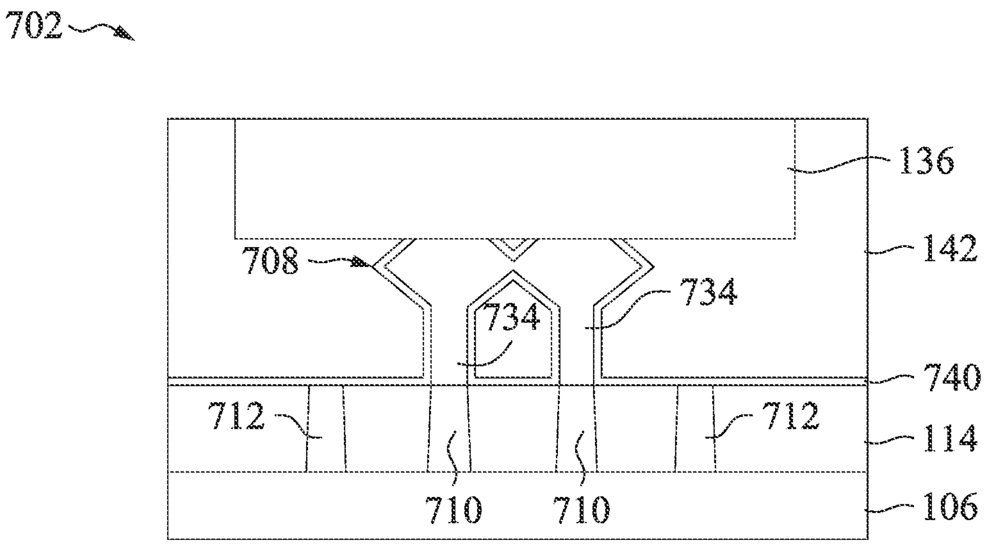
FIGS. 13-15 are schematic cross-sectional views, taken outside the gate region, of example FinFET devices of FIG. 1 or 6, according to embodiments of the present disclosure.
Figure 14:
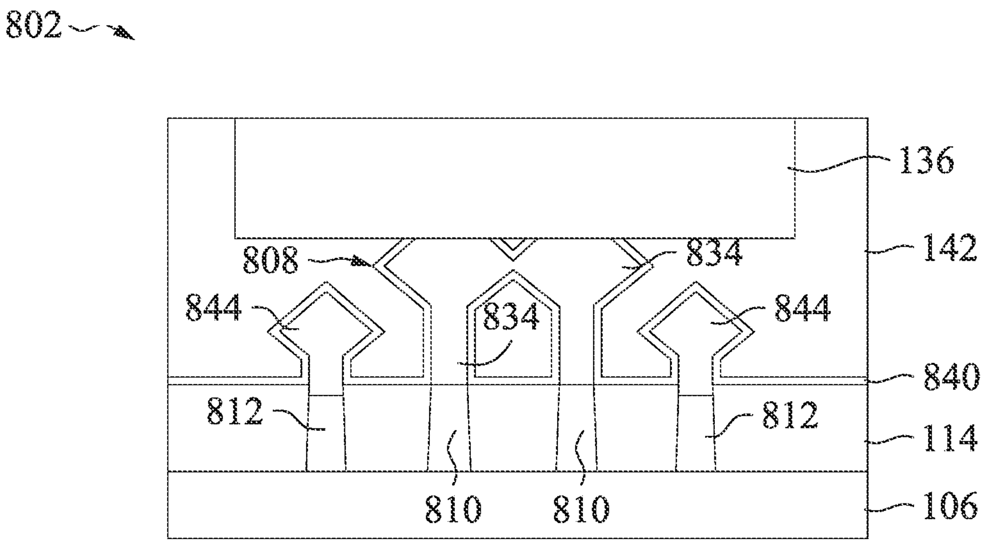
Figure 15:
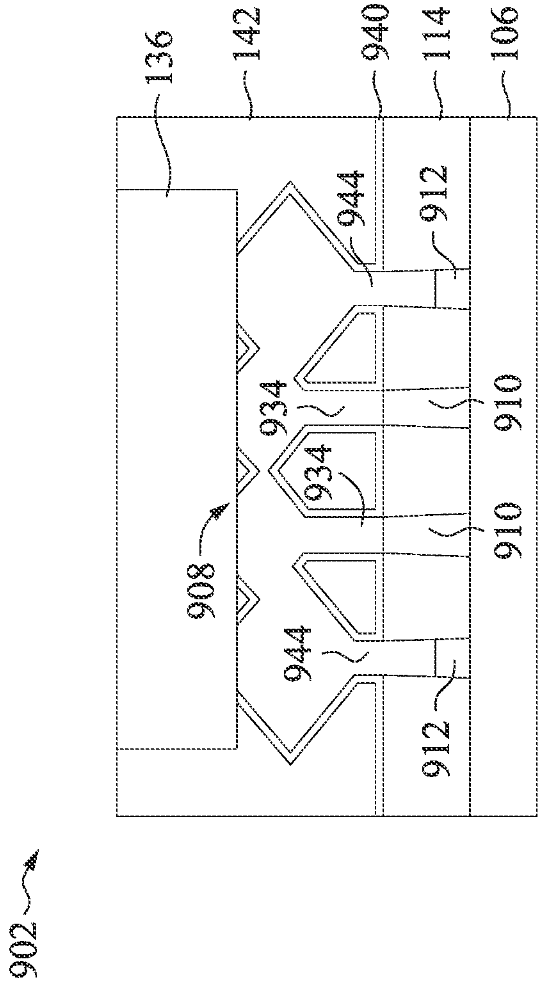

FIGS. 13-15 are schematic cross-sectional views, taken outside the gate region, of example FinFET devices of FIG. 1 or 6, according to embodiments of the present disclosure. FinFET devices 702, 802, 902 are similar to FinFET devices 102*a*, 102*b* except for variations, with respect to the extra fins, in height, presence of a sidewall spacer capping layer, and/or presence of epitaxial S/D features, etc. Certain aspects of the FinFET devices (e.g., dielectric layers, conductive layer, contact vias, and IMD layer) are omitted from FIGS. 13-15 for clarity.

As shown in FIG. 13, a FinFET device 702 includes, outside the gate region, a S/D region 708, a first set of fin structures 710, and a second set of extra fin structures 712. The S/D region 708 may include epitaxial S/D features 734 (e.g., p-type or n-type). The epitaxial S/D features 734 may be formed over (e.g., in contact with) respective fin structures 710 of the first set. The FinFET device 702 may include a CESL 740 over the extra fin structures 712 and surrounding the S/D features 734.

As shown in FIG. 13, the extra fin structures 712 do not extend above the fin structures 710 (e.g., ending below the ILD layer 142). In some embodiments, the extra fin structures 712 may be formed, or cut, to have a height equal to or less than the height of the fin structures 710, such that top surfaces of the extra fin structures 712 are at or below top surfaces of the fin structures 710. In some embodiments, the CESL 740 may be flat (e.g., lying in a plane that extends over the top surfaces of the extra fin structures 712). Device performance may be tuned based on the FinFET device 702 including the extra fin structures 712 that are cut.

As shown in FIG. 14, a FinFET device 802 includes, outside the gate region, a S/D region 808, a first set of fin structures 810, and a second set of extra fin structures 812. The S/D region 808 may include epitaxial S/D features 834 (e.g., p-type or n-type). The epitaxial S/D features 834 may be formed over (e.g., in contact with) respective fin structures 810 of the first set. The FinFET device 802 may include a CESL 840 surrounding the S/D features 834. The FinFET device 802 may include epitaxial features 844. The epitaxial features 844 may be formed over (e.g., in contact with) respective extra fin structures 812 of the second set. The epitaxial features 844 may be separated from, or non-merging with, the epitaxial S/D features 834 (e.g., with the ILD layer 142 in between). In some embodiments, greater spacing between the extra fin structures 812 and adjacent fin structures 810 may further prevent merging. In some embodiments, the epitaxial features 844 may be formed using the same process as (e.g., concurrently with) the epitaxial S/D features 834. The CESL 840 may surround the epitaxial features 844.

As shown in FIG. 14, the extra fin structures 812 do not extend above the fin structures 810 (e.g., ending below the ILD layer 142). In some embodiments, the extra fin structures 812 may be formed, or cut, to have a height equal to or less than the height of the fin structures 810, such that top surfaces of the extra fin structures 812 are at or below top surfaces of the fin structures 810. In some embodiments, the extra fin structures 812 may be lower than the fin structures 810 and the epitaxial features 844 may extend to a depth that is below the top surface of the insulating material 114 of the STI feature. Device performance may be tuned based on the FinFET device 802 including the epitaxial features 844.

As shown in FIG. 15, a FinFET device 902 includes, outside the gate region, a S/D region 908, a first set of fin structures 910, and a second set of extra fin structures 912. The S/D region 908 may include epitaxial S/D features 934 (e.g., p-type or n-type). The epitaxial S/D features 934 may be formed over (e.g., in contact with) respective fin structures 910 of the first set. The FinFET device 902 may include a CESL 940 surrounding the S/D features 934. The FinFET device 902 may include epitaxial features 944. The epitaxial features 944 may be similar to the epitaxial features 844 shown in FIG. 14. The epitaxial features 944 may be formed over (e.g., in contact with) respective extra fin structures 912 of the second set. The epitaxial features 944 may be merged with the epitaxial S/D features 934. In some embodiments, the epitaxial features 944 may be formed using the same process as (e.g., concurrently with) the epitaxial S/D features 934. The CESL 940 may surround the epitaxial features 944.

As shown in FIG. 15, the extra fin structures 912 do not extend above the fin structures 910 (e.g., ending below the ILD layer 142). In some embodiments, the extra fin structures 912 may be formed, or cut, to have a height equal to or less than the height of the fin structures 910, such that top surfaces of the extra fin structures 912 are at or below top surfaces of the fin structures 910. In some embodiments, the extra fin structures 912 may be lower than the fin structures 910 and the epitaxial features 944 may extend to a depth that is below the top surface of the insulating material 114 of the STI feature. Device performance may be tuned based on the FinFET device 902 including the epitaxial features 944.

Comparing FIGS. 14 and 15, the extra fin structures 912 are shorter than the extra fin structures 812. The shorter fin structures and/or greater depth may cause the epitaxial features 944 to grow larger (e.g., wider), which may promote merging and provide a larger landing area for the S/D contact 136. As a result of the larger size of the epitaxial features 944 and/or the larger landing area for the S/D contact 136, at least compared to the epitaxial features 844 of FIG. 14, for example, device resistance may be lowered (with corresponding higher current), which may be particularly beneficial for device performance.

Figure 16A:
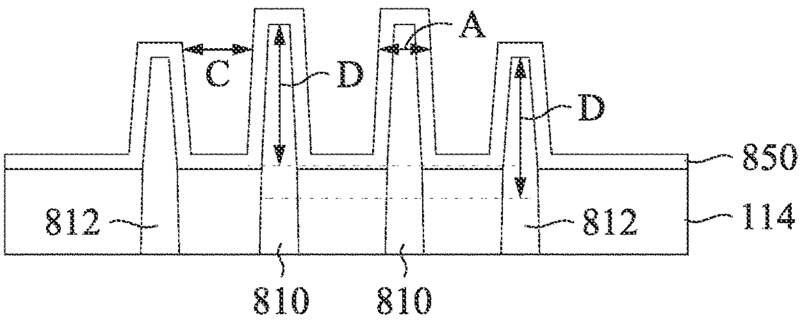
FIGS. 16A, 16 B, and 16C schematically illustrate various stages of forming the epitaxial features of FIG. 14, according to embodiments of the present disclosure.
Figure 16B:
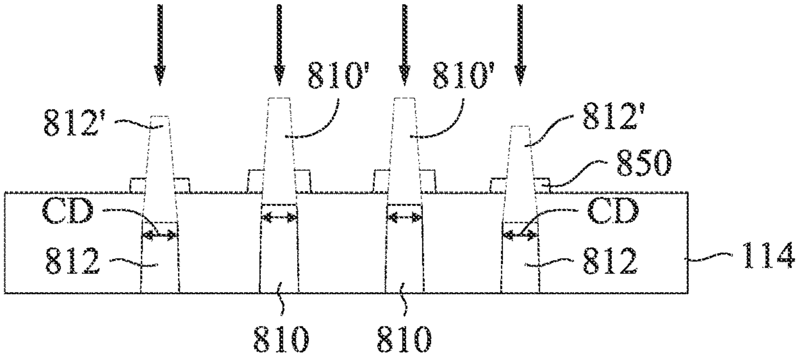
Figure 16C:
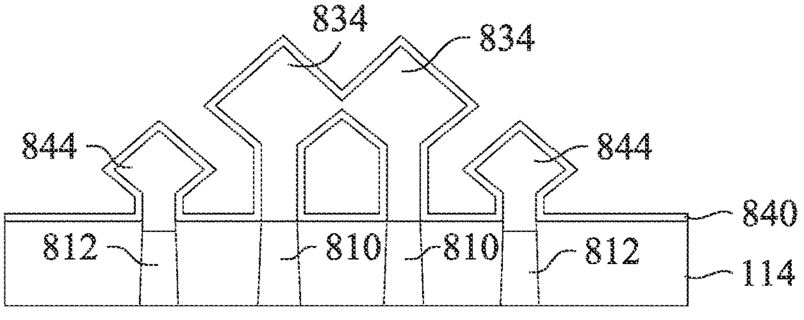

FIGS. 16A-16C schematically illustrate various stages of forming the epitaxial features 834/844 of FIG. 14, according to embodiments of the present disclosure. As shown in FIG. 16A, the fin structures 810/812 are formed and a spacer material 850 is deposited over the fin structures 810/812. Certain dimensions of the fin structures 810/812 are indicated, including fin width A, fin-to-fin spacing C, and fin height D. These dimensions are described in more detail below with respect to FIG. 17A. As shown in FIG. 16B, an etch back process is performed to remove portions of the fin structures 810/812 and open corresponding recesses 810'/812' for defining a growth pattern of the epitaxial features 834/844. As shown in FIG. 16C, the epitaxial features 834/844 are formed and a CESL 840 is deposited over the epitaxial features 834/844.

Figure 17A:
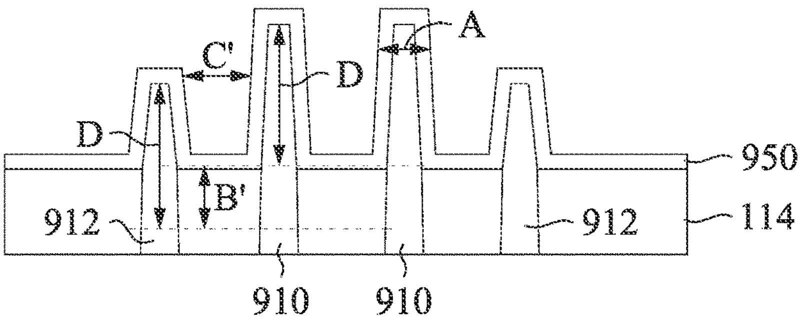
FIGS. 17A, 17B, and 17C schematically illustrate various stages of forming the epitaxial features of FIG. 15, according to embodiments of the present disclosure.
Figure 17B:
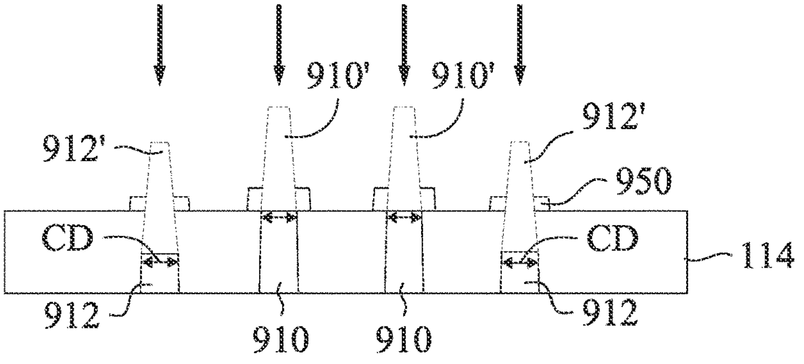
Figure 17C:
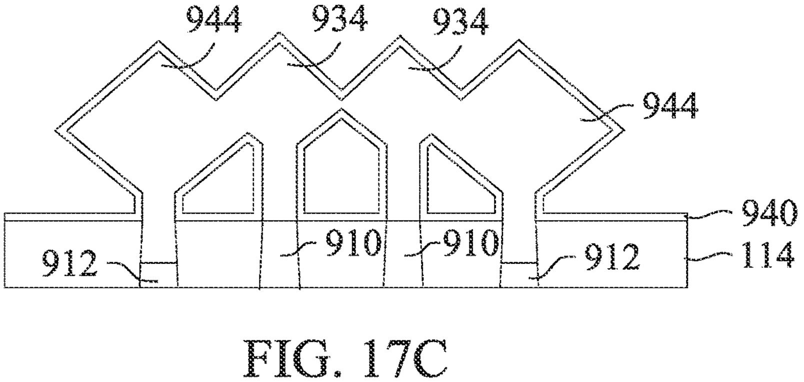

FIGS. 17A-17C schematically illustrate various stages of forming the epitaxial features 934/944 of FIG. 15, according to embodiments of the present disclosure. As shown in FIG. 17A, the fin structures 910/912 are formed and the spacer material 950 is deposited over the fin structures 910/912. In some embodiments, the fin-to-fin spacing C' of the fin structures 910/912 may be less than the fin-to-fin spacing C of the fin structures 810/812. For example, the fin-to-fin spacing C' may be in a range between 2*A and 0.85*C. In some embodiments, a depth B' of the fin structures 910/912 may be greater than a corresponding depth of the fin structures 810/812. For example, the depth B' may be greater than or equal to 0.4*D. As shown in FIG. 17B, an etch back process is performed to remove portions of the fin structures 910/912 and open corresponding recesses 910'/912' for defining a growth pattern of the epitaxial features 934/944. As shown in FIG. 17C, the epitaxial features 934/944 are formed and a CESL 940 is deposited over the epitaxial features 934/944.

Comparing FIGS. 16A-16C and 17A-17C, the recesses 912' are greater in depth than the recesses 812', the top surfaces of the resultant fin structures 912, adjacent the recesses 912', have wider critical dimension (CD) than the top surfaces of the resultant fin structures 812, adjacent the recesses 812', and the epitaxial features 944 are larger than the epitaxial features 844, as described above with respect to FIGS. 14 and 15.

Figure 18:
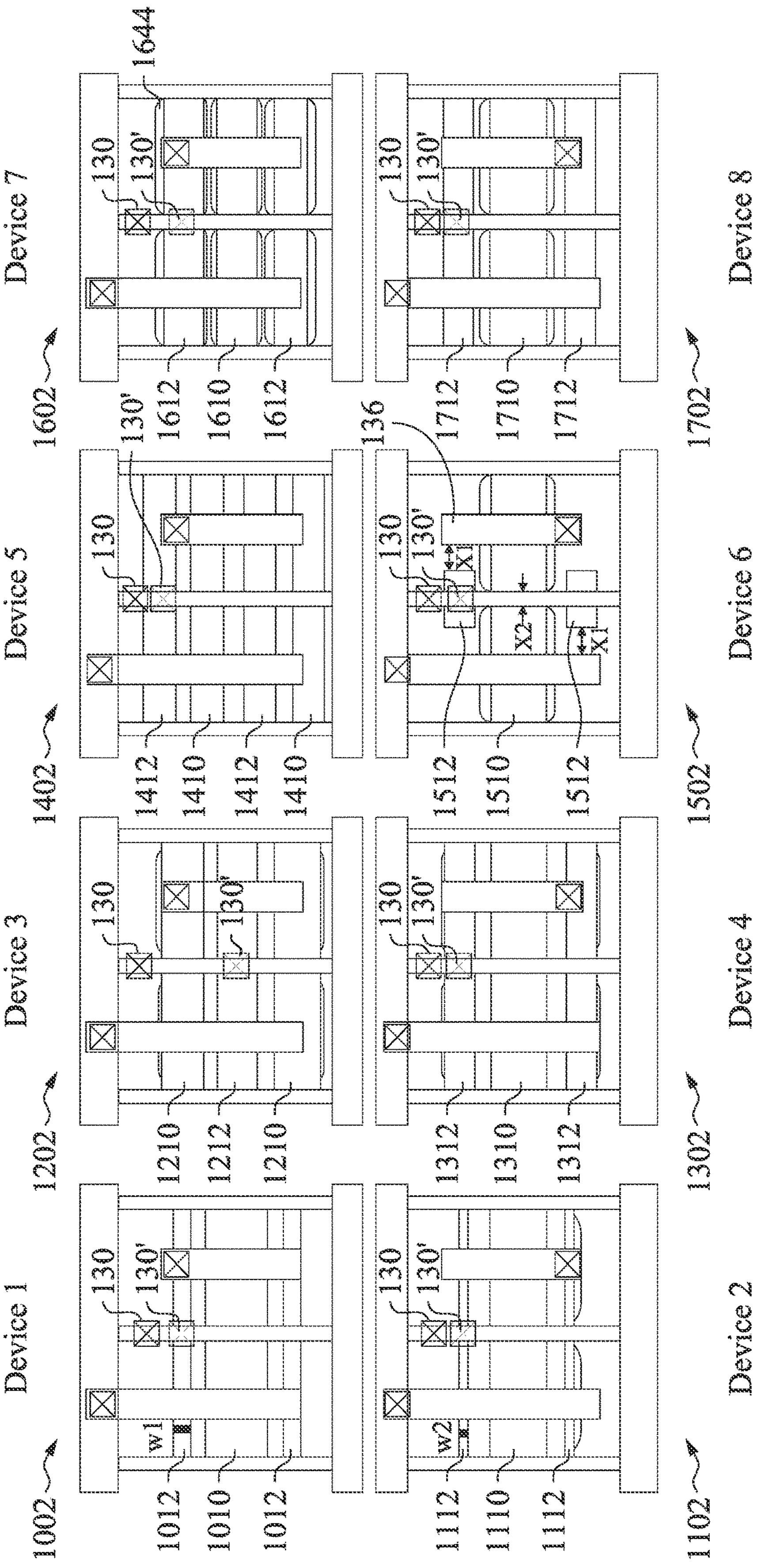
FIG. 18 illustrates schematic top views of example semiconductor devices that incorporate one or more aspects described herein, according to embodiments of the present disclosure.

FIG. 18 illustrates schematic top views of example semiconductor devices that incorporate one or more aspects described herein, according to embodiments of the present disclosure. Certain aspects of the semiconductor devices (e.g., metal lines) are omitted from FIG. 18 for clarity.

Device 1 illustrates a FinFET device 1002 with extra fin structures 1012 of first width w1. With respect to Device 1, and the other devices illustrated in FIG. 18, the extra fin structures may be active and, as a result, may provide a transistor function. Device 1 may include one or more active fin structures 1010 (e.g., 2-3 active fin structures located within the active area defined by box 1010). In some embodiments, the extra fin structures 1012 may have different heights (e.g., high and low fin heights). For example, Device 1 may incorporate one or more aspects of the FinFET device 202*a* (FIG. 7) and/or the FinFET device 302 (FIG. 9). Device 2 illustrates a FinFET device 1102 with extra fin structures 1112 that are small (e.g., narrower or tapered), such as having a second width w2 that is less than the first width w1 of Device 1. Device 2 may include one or more active fin structures 1110 (e.g., 2-3 active fin structures located within the active area defined by box 1110). In some embodiments, Device 2 may incorporate one or more aspects of the FinFET device 202*b* (FIG. 8) and/or the FinFET device 502 (FIG. 11). Device 3 illustrates a FinFET device 1202 with one or more extra fin structures 1212 that are inner fin structures (e.g., 1-2 inner fin structures located within the active area defined by box 1212). For example, the one or more inner fin structures may be between the active fin structures 1210. In some embodiments, Device 3 may incorporate one or more aspects of the FinFET device 402*a/b* (FIG. 10). Device 4 illustrates a FinFET device 1302 with one or more extra fin structures 1312 that are outer fin structures (e.g., two sets of outer fin structures are shown). The one or more outer fin structures may be outside (e.g., surrounding) the active fin structures 1310. Each set of outer fin structures may include one or more outer fin structures (e.g., 1-2 outer fin structures located within the active areas defined by respective boxes 1312). In some embodiments, Device 4 may incorporate one or more aspects of the FinFET device 602 (FIG. 12). Device 5 illustrates a FinFET device 1402 with one or more extra fin structures 1412 that are alternating with the active fin structures 1410. For example, the extra fin structures 1412 may include inner fin structures and outer fin structures (e.g., one set of inner fin structures and another set of outer fin structures are shown). Each set of inner and outer fin structures may include one or more fin structures (e.g., 1-2 fin structures located within the active areas defined by respective boxes 1412).

Device 6 illustrates a FinFET device 1502 with extra fin structures 1512 that are short lengthwise (e.g., extending only through the gate region (e.g., channel) and/or not continuing through the S/D region). For example, the short fin structures may be spaced from the S/D contacts 136 by a distance X1. When gate length is X2, a ratio of X1/X2 is within a range of 0.03 to 1.5. Device 6 may include one or more short fin structures (e.g., two or more short fin structures, such as two short fin structures). In some embodiments, the portions of the short fin structures outside the gate region may be cut. Device 6 may include one or more active fin structures 1510 (e.g., 2-3 active fin structures located within the active area defined by box 1510). In some embodiments, the epitaxial structures of Device 6 may be non-merging. In some embodiments, Device 6 may incorporate one or more aspects of the FinFET device 702 (FIG. 13).

Device 7 illustrates a FinFET device 1602 with extra fin structures 1612 that include small epitaxial features 1644 outside the gate region (e.g., dummy features). Device 7 may include one or more small epitaxial features 1644 (e.g., only one small epitaxial feature is shown per extra fin structure). Device 7 may include one or more active fin structures 1610 (e.g., 1-2 active fin structures located within the active area defined by box 1610). In some embodiments, the small epitaxial structures 1644 of Device 7 may be non-merging. In some embodiments, Device 7 may incorporate one or more aspects of the FinFET device 802 (FIG. 14).

Device 8 illustrates a FinFET device 1702 with extra fin structures 1712 that are capped outside the gate region (e.g., with a spacer material). Device 8 may include one or capped fin structures. Device 8 may include one or more active fin structures 1710 (e.g., 2-3 active fin structures located within the active area defined by box 1710). In some embodiments, the epitaxial structures of Device 8 may be non-merging. In some embodiments, Device 8 may incorporate one or more aspects of the FinFET device 102*a/b* (FIG. 4 or 5).

The example semiconductor devices of FIG. 18 illustrate two different optional positions of the gate contact via. For example, the gate contact via may be configurable between a first position 130 that is not overlapping the extra fin structure to a second position 130' (shown in phantom) that is overlapping the extra fin structure. The position of the gate contact via may be provide additional adjustment for the work function and/or tuning for $V_t$.

Figure 19:
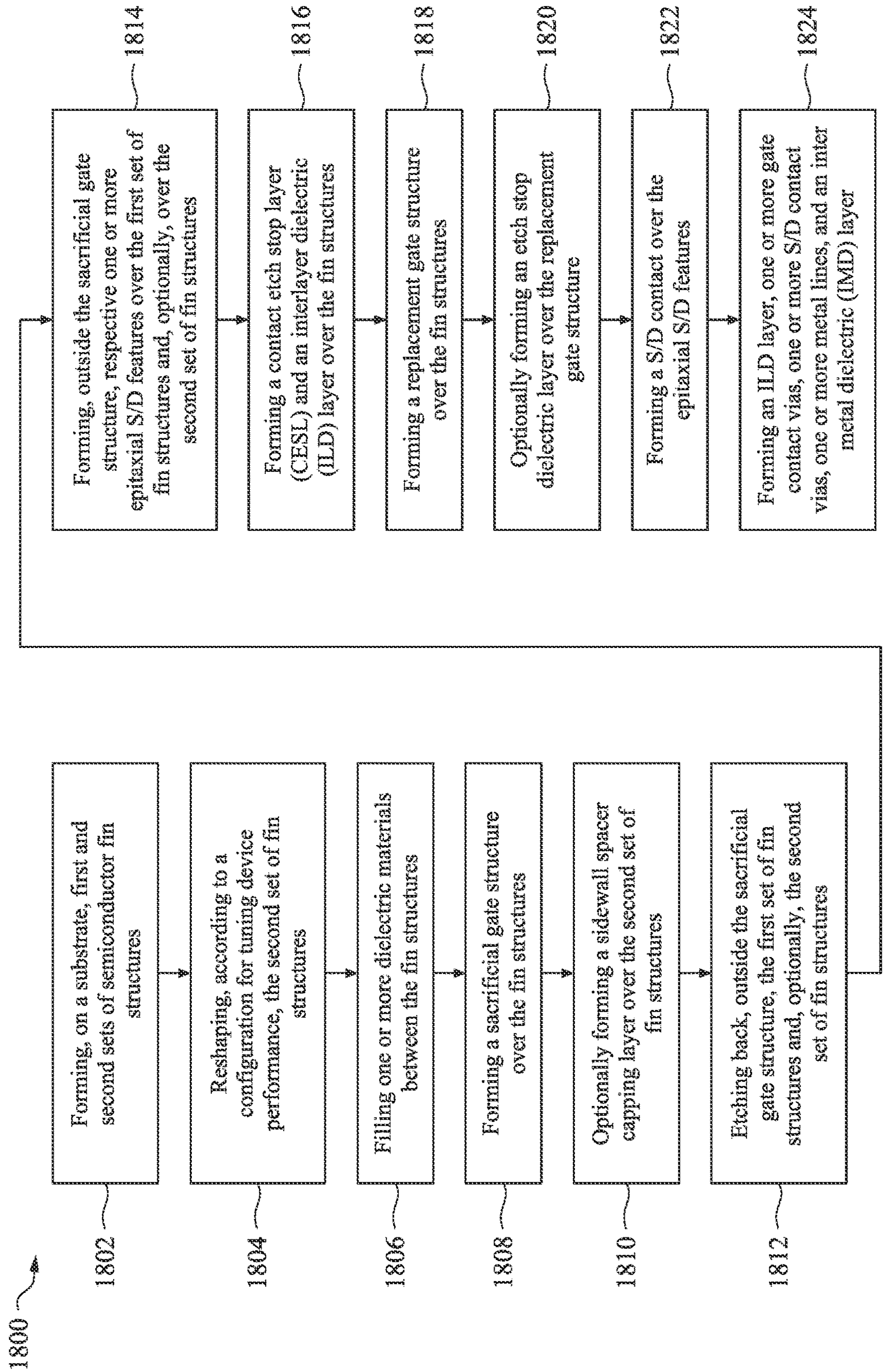
FIG. 19 is a flow chart of a method of forming a FinFET of a semiconductor device, according to embodiments of the present disclosure.

FIG. 19 is a flow chart of a method 1800 of forming a FinFET of a semiconductor device, according to embodiments of the present disclosure. The method 1800 may be understood to relate to any embodiments, or combinations of embodiments, described herein and/or illustrated in FIGS. 1-18, without limitation. At block 1802, the method 1800 may include forming, on a substrate, first and second sets of semiconductor fin structures. For example, the semiconductor fin structures may include a first set of fin structures that are active and a second set of fin structure that are extra. The second set of fin structures may be either active or non-active as described above. At block 1804, the method 1800 may include reshaping, according to a configuration for tuning device performance, the second set of fin structures. For example, the second set of fin structures may be reshaped relative to the first set of fin structures. In some embodiments, the method 1800 may include selectively reshaping the second set of fin structures to improve device performance. For example, selectively reshaping (e.g., using a patterning process) the second set of fin structures may include one or more of: causing the second set of fin structures to be different height from the first set of fin structures, causing first and second fin structures, of the second set, to be different heights from each other; causing one or more fin structures, of the second set, to be tapered; causing at least one inner fin structure, of the second set, to be located between a first active fin structure, of the first set, and a second active fin structure of another set of active fin structures; or causing at least two fin structures, of the second set, to be located on a first side, of first and second opposite sides, of the first set of fin structures.

At block 1806, the method 1800 may include filling one or more dielectric materials between the fin structures. For example, the one or more dielectric materials may include a shallow trench isolation (STI) feature and one or more other dielectric layers. For example, the one or more dielectric materials may be deposited over and/or around the first set of fin structures and the second set of fin structures. At block 1808, the method 1800 may include forming a sacrificial ("dummy") gate structure over the fin structures. For example, the sacrificial gate may include a sacrificial gate dielectric layer and a sacrificial gate electrode layer that are deposited and subsequently patterned to form the sacrificial gate structure.

At block 1810, the method 1800 may include optionally forming a sidewall spacer capping layer over the second set of fin structures. In some embodiments, the sidewall spacer capping layer is formed before block 1812 to prevent etching back of the second set of fin structures. In some embodiments, the sidewall spacer capping layer is formed before block 1814 to prevent epitaxial growth on the second set of fin structures. At block 1812, the method 1800 may include etching back, outside the sacrificial gate structure, the first set of fin structures and, optionally, the second set of fin structures. At block 1814, the method 1800 may include forming, outside the sacrificial gate structure, respective one or more epitaxial S/D features over the first set of fin structures and, optionally, over the second set of fin structures.

In some embodiments, the method 1800 may include selectively controlling the second set of fin structures to improve device performance. For example, as described in more detail above, selectively controlling the second set of fin structures, outside a gate region of the FinFET, may include one or more of: forming a spacer material over the second set of fin structures; causing the second set of fin structures to be equal to or less than a height of the first set of fin structures; causing the second set of fin structures to include epitaxial features that are non-merging with epitaxial S/D features of the first set of fin structures; or causing the second set of fin structures to include epitaxial features that are merging with the epitaxial S/D features of the first set of fin structures.

At block 1816, the method 1800 may include forming a CESL and an ILD layer ("ILD0") over the fin structures. At block 1818, the method 1800 may include forming a replacement gate structure over the fin structures. For example, forming the replacement gate structure may include depositing a gate dielectric over the fin structures and depositing, subsequently, a gate electrode over the gate dielectric. In some embodiments, the gate electrode may be deposited using a single deposition process. In some other embodiments, for example illustrated in FIGS. 9-12, the gate electrode may be deposited using a plurality of sequential deposition processes to form different portions of the gate electrode with a plurality of distinct material compositions. For example, separate patterning and deposition processes may be applied to form different portions of the gate electrode.

At block 1820, the method 1800 may include optionally forming an etch stop dielectric layer over the replacement gate structure. At block 1822, the method 1800 may include forming a S/D contact over the epitaxial S/D features. At block 1824, the method 1800 may include forming an ILD layer, one or more gate contact vias, one or more S/D contact vias, one or more metal lines, and an inter metal dielectric (IMD) layer.

It will be understood that not all advantages have been necessarily discussed herein, no particular advantage is required for all embodiments or examples, and other embodiments or examples may offer different advantages.

Some embodiments of the present provide a semiconductor device, comprising: a Fin Field Effect Transistor (FinFET), including: a first set of fin structures that are active; a source/drain (S/D) region in contact with the first set of fin structures; a second set of fin structures separated, via a shallow trench isolation (STI) feature, from the first set of fin structures; a contact etch stop layer (CESL) over the S/D region and over the second set of fin structures, wherein the second set of fin structures includes one or more non-active fin structures that are in contact with the CESL without being in contact with the S/D region; and a gate over the first set of fin structures and over the second set of fin structures, the gate including: a gate dielectric; and a gate electrode over the gate dielectric.

Some embodiments of the present disclosure provide method of manufacturing a semiconductor device, comprising: forming, on a substrate, first and second sets of fin structures; reshaping the second set of fin structures without affecting the first set of fin structures; filling one or more dielectric materials between fin structures of the first and second sets of fin structures; forming a sacrificial gate structure over the first and second sets of fin structures; etching back, outside the sacrificial gate structure, the first set of fin structures; forming, outside the sacrificial gate structure, respective one or more epitaxial S/D features over the first set of fin structures; forming a CESL and an interlayer dielectric (ILD) layer over the fin structures; and forming a replacement gate over the first and second sets of fin structures.

Some embodiments of the present disclosure provide a method of manufacturing a semiconductor device, comprising: forming a FinFET, including: a first set of fin structures that are active; a S/D region in contact with the first set of fin structures; a second set of fin structures separated, via an STI feature, from the first set of fin structures; a contact etch stop layer (CESL) over the S/D region and over the second set of fin structures, wherein the second set of fin structures includes one or more non-active fin structures that are in contact with the CESL without being in contact with the S/D region; and a gate over the first set of fin structures and over the second set of fin structures, the gate including: a gate dielectric; and a gate electrode over the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a Fin Field Effect Transistor (FinFET), including:
- a first set of fin structures that are active;
- a source/drain (S/D) region in contact with the first set of fin structures;
- a second set of fin structures separated, via a shallow trench isolation (STI) feature, from the first set of fin structures;
- a contact etch stop layer (CESL) over the S/D region and over the second set of fin structures,
  - wherein the second set of fin structures includes one or more non-active fin structures that are in contact with the CESL without being in contact with the S/D region; and
- a gate over the first set of fin structures and over the second set of fin structures, the gate including:
  - a gate dielectric; and
  - a gate electrode over the gate dielectric, wherein the second set of fin structures comprises:
- a first fin structure with a first height; and
- a second fin structure with a second height that is different from the first height, wherein a portion of the gate electrode surrounding the first fin structure includes a material composition that is different from another portion of the gate electrode surrounding the second fin structure.

2. The semiconductor device of claim 1, wherein the one or more non-active fin structures are outside an active region associated with the S/D region of the first set of fin structures.

3. The semiconductor device of claim 1, wherein the FinFET is a first FinFET, the S/D region is a first S/D region, the gate is a first gate, the gate dielectric is a first gate dielectric, and the gate electrode is a first gate electrode, the semiconductor device further comprising a second FinFET including:
- a third set of fin structures that are active and a second S/D region in contact with the third set of fin structures;
- a fourth set of fin structures separated, via another STI feature, from the third set of fin structures,
  - wherein the fourth set of fin structures is to be configured for further tuning device performance; and
- a second gate including:
  - a second gate dielectric formed over the third set of fin structures and over the fourth set of fin structures; and
  - a second gate electrode formed over the second gate dielectric.

4. The semiconductor device of claim 1, wherein the FinFET further includes a sidewall spacer capping layer formed over the second set of fin structures outside a gate region of the FinFET.

5. The semiconductor device of claim 1, wherein the second set of fin structures comprises one or more tapered fin structures, wherein a tapered width of the one or more tapered fin structures is within a range of about 0.5x to about 1x.

6. The semiconductor device of claim 1, wherein the second set of fin structures comprises at least one inner fin structure that is located between a first active fin structure of the first set of fin structures, and a second active fin structure of another set of active fin structures.

7. The semiconductor device of claim 1, wherein the second set of fin structures comprises:
- a first fin structure that is non-tapered; and
- a second fin structure that is tapered.

8. The semiconductor device of claim 1, wherein the second set of fin structures comprises at least two fin structures located on a first side of the first set of fin structures.

9. The semiconductor device of claim 1, wherein, outside a gate region of the FinFET, the second set of fin structures are cut to be equal to or less than a height of the first set of fin structures.

10. The semiconductor device of claim 1, wherein the S/D region includes first epitaxial S/D features, the semiconductor device further comprising second epitaxial S/D features formed on the second set of fin structures that are non-merging with the first epitaxial S/D features.

11. The semiconductor device of claim 1, wherein the S/D region includes first epitaxial S/D features, the semiconductor device further comprising second epitaxial S/D features formed on the second set of fin structures that are merging with the first epitaxial S/D features.

12. A method of manufacturing a semiconductor device, comprising:
- forming, on a substrate, first and second sets of fin structures;
- reshaping the second set of fin structures without affecting the first set of fin structures;
- filling one or more dielectric materials between fin structures of the first and second sets of fin structures;

etching back the one or more dielectric materials to a level below the first and second sets of fin structures, wherein the first sets of fin structures protrude over the one or more dielectric materials at a first height, the second sets of fin structures protrude over the one or more dielectric materials at a second height different from the first height;

forming a sacrificial gate structure over the first and second sets of fin structures;

etching back, outside the sacrificial gate structure, the first set of fin structures;

forming, outside the sacrificial gate structure, respective one or more epitaxial S/D features over the first set of fin structures;

forming a CESL and an interlayer dielectric (ILD) layer over the fin structures; and forming a replacement gate over the first and second sets of fin structures.

13. The method of claim 12, wherein forming the replacement gate comprises:

depositing a gate dielectric over the fin structures; and depositing, subsequently, a gate electrode over the gate dielectric, wherein the gate electrode is deposited using a plurality of sequential deposition processes to form different portions of the gate electrode with a plurality of distinct material compositions.

14. The method of claim 13, further comprising:

forming a S/D contact over the S/D features;

forming another ILD layer;

forming one or more gate contact vias to the replacement gate;

forming one or more S/D contact vias to the S/D contact;

forming one or more metal lines over the ILD layer; and forming an inter metal dielectric (IMD) layer over the one or more metal lines.

15. The method of claim 14, further comprising:

etching back, outside the sacrificial gate structure, the second set of fin structures; and forming, outside the sacrificial gate structure, respective one or more other epitaxial S/D features over the second set of fin structures.

16. The method of claim 12, wherein reshaping the second set of fin structures comprises: tapering one or more fin structures in the second set of fin structures.

17. The method of claim 12, wherein the replacement gate has a first portion surrounding the first fin structures and a second portion surrounding the second fin structures, and the first portion includes a material composition that is different from the second portion.

18. A method of manufacturing a semiconductor device, comprising:

forming a FinFET, including:

a first set of fin structures that are active;

a S/D region in contact with the first set of fin structures;

a second set of fin structures separated, via an STI feature, from the first set of fin structures, wherein the second set of fin structures comprises:

a first fin structure that is non-tapered; and a second fin structure that is tapered;

a contact etch stop layer (CESL) over the S/D region and over the second set of fin structures, wherein the second set of fin structures includes one or more non-active fin structures that are in contact with the CESL without being in contact with the S/D region; and a gate over the first set of fin structures and over the second set of fin structures, the gate including:

a gate dielectric; and a gate electrode over the gate dielectric.

19. The method of claim 18, wherein forming the second set of fin structures comprises one or more of:

forming first and second fin structures, of the second set, with different heights;

forming one or more fin structures, of the second set, to be tapered;

forming at least one inner fin structure, of the second set, that is located between a first active fin structure, of the first set, and a second active fin structure of another set of active fin structures; or forming at least two fin structures, of the second set, that are located on a first side of the first set of fin structures.

20. The method of claim 18, wherein forming the second set of fin structures, outside a gate region of the FinFET, comprises one or more of:

forming a sidewall spacer capping layer over the second set of fin structures;

forming the second set of fin structures to be equal to or less than a height of the first set of fin structures;

forming the second set of fin structures to include epitaxial features that are non-merging with epitaxial S/D features of the first set of fin structures; or forming the second set of fin structures to include epitaxial features that are merging with the epitaxial S/D features of the first set of fin structures.

* * * * *